(12) United States Patent
Uchida

(10) Patent No.: US 7,307,339 B2
(45) Date of Patent: Dec. 11, 2007

(54) SEMICONDUCTOR DEVICE HAVING CURVED LEADS OFFSET FROM THE CENTER OF BONDING PADS

(75) Inventor: Masami Uchida, Sabata (JP)

(73) Assignee: Seiko Epson Corporation, Tokyo (JP)

( * ) Notice: Subject to any disclaimer, the term of this patent is extended or adjusted under 35 U.S.C. 154(b) by 132 days.

(21) Appl. No.: 10/960,099

(22) Filed: Oct. 8, 2004

(65) Prior Publication Data

US 2005/0116339 A1    Jun. 2, 2005

(30) Foreign Application Priority Data

Oct. 17, 2003    (JP)    ............................. 2003-358077

(51) Int. Cl.
*H01L 23/495* (2006.01)
*H01R 9/00* (2006.01)

(52) U.S. Cl. ...................... 257/669; 257/674; 257/692; 257/773; 361/773; 361/813

(58) Field of Classification Search ................ 257/669, 257/735, 747
See application file for complete search history.

(56) References Cited

U.S. PATENT DOCUMENTS 5,825,081 A * 10/1998 Hosomi et al. ............. 257/668

| | | | |
|---|---|---|---|
| 6,342,727 B1 * | 1/2002 | Fujimori | ...................... 257/668 |
| 6,559,524 B2 * | 5/2003 | Seko | ........................... 257/673 |
| 6,605,523 B2 | 8/2003 | Takano | |
| 6,737,752 B2 * | 5/2004 | Hilton | ......................... 257/778 |
| 2004/0178501 A1 | 9/2004 | Son et al. | |

FOREIGN PATENT DOCUMENTS

| | | |
|---|---|---|
| JP | A-04-287937 | 10/1992 |
| JP | A-07-029936 | 1/1995 |
| JP | A-11-186332 | 7/1999 |
| JP | A-2001-326243 | 11/2001 |
| JP | A-2002-184812 | 6/2002 |
| JP | A-2004-193223 | 7/2004 |
| JP | A-2004-274007 | 9/2004 |

* cited by examiner

*Primary Examiner*—Alonzo Chambliss
(74) *Attorney, Agent, or Firm*—Oliff & Berridge, PLC

(57) ABSTRACT

A semiconductor device including: a substrate on which a plurality of leads are formed; and a semiconductor chip mounted on the substrate in such a manner that a surface of the semiconductor chip having a plurality of electrodes faces the substrate. Each of the leads includes a first portion that is bonded to one of the electrodes and a second portion that extends outward from the inner side of a region in the substrate that overlays the semiconductor chip. The second portion is entirely adhered to the substrate and curved.

10 Claims, 7 Drawing Sheets

SEMICONDUCTOR DEVICE HAVING CURVED LEADS OFFSET FROM THE CENTER OF BONDING PADS

Japanese Patent Application No. 2003-358077, filed on Oct. 17, 2003, is hereby incorporated by reference in its entirety.

BACKGROUND OF THE INVENTION

The present invention relates to a semiconductor device and a method of fabrication thereof, an electronic module, together with an electronic instrument.

In chip-on-film (COF) packaging, a semiconductor chip is mounted on a substrate. Since the substrate and the semiconductor chip have different coefficients of thermal expansion, stress is generated in connective portions between leads formed on the substrate and electrodes of the semiconductor chip. Since fine leads are easily broken by stress, it is required to prevent such a situation. In addition, since the substrate and the semiconductor chip have different coefficients of thermal expansion, it would be impossible to ensure good electrical connections if there are large displacements of the leads and electrodes.

BRIEF SUMMARY OF THE INVENTION

According to a first aspect of the present invention, there is provided a semiconductor device comprising:

a substrate on which a plurality of leads are formed; and a semiconductor chip mounted on the substrate in such a manner that a surface of the semiconductor chip having a plurality of electrodes faces the substrate, wherein each of the leads includes a first portion that is bonded to one of the electrodes and a second portion that extends outward from the inner side of a region in the substrate that overlays the semiconductor chip; and wherein the second portion is entirely adhered to the substrate and curved.

According to a second aspect of the present invention, there is provided a semiconductor device comprising:

a substrate on which a plurality of leads are formed; and a semiconductor chip mounted on the substrate in such a manner that a surface of the semiconductor chip having a plurality of electrodes faces the substrate, wherein each of the leads includes a first portion that is bonded to one of the electrodes and a second portion that continuously extends outward from the first portion; and wherein the second portion is entirely adhered to the substrate and curved.

According to a third aspect of the present invention, there is provided an electronic module on which is mounted any of the above-described semiconductor devices.

According to a fourth aspect of the present invention, there is provided an electronic instrument comprising any of the above-described semiconductor devices.

According to a fifth aspect of the present invention, there is provided a method of fabricating a semiconductor device, the method comprising:

(a) heating a semiconductor chip having a plurality of electrodes and a substrate on which a plurality of leads are provided;

(b) mounting the semiconductor chip on the substrate in such a manner that each of the leads faces one of the electrodes; and (c) bonding each of the leads to one of the electrodes, wherein the substrate is formed of a material having a linear expansion rate that is greater than a linear expansion rate of the semiconductor chip; and wherein the substrate and the semiconductor chip are each heated in the step (a) at a temperature at which the rates of change of the lengths of the substrate and the semiconductor chip before and after the heating are the same.

According to a sixth aspect of the present invention, there is provided a method of fabricating a semiconductor device, the method comprising:

(a) heating and expanding a semiconductor chip having a plurality of electrodes and a substrate on which a plurality of leads are provided;

(b) mounting the semiconductor chip on the substrate in such a manner that a first portion of each of the leads faces one of the electrodes;

(c) bonding the first portion to one of the electrodes; and (d) radiating heat of the semiconductor chip and the substrate and causing the semiconductor chip and the substrate to shrink, wherein each of the leads includes a second portion that continuously extends outward from the first portion and entirely adhered to the substrate; and wherein the step (d) includes:

($d_1$) causing the semiconductor chip to shrink at a shrinkage rate that is greater than a shrinkage rate of the substrate, applying a force of the shrinkage direction to the second portion through the first portion to curve the second portion; and ($d_2$) causing the substrate to shrink at a shrinkage rate that is greater than a shrinkage rate of the semiconductor chip, applying a force of the shrinkage direction to the second portion that is adhered to the substrate to curve the second portion.

DETAILED DESCRIPTION OF THE EMBODIMENTS

Figure 1:
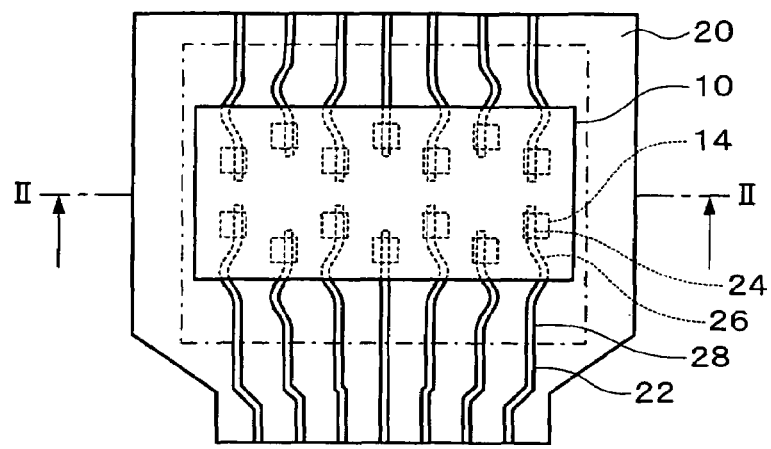
FIG. 1 is illustrative of a semiconductor device according to a first embodiment of the present invention.

An objective of the embodiments of the present invention is to increase the reliability of the electrical connection between leads and electrodes.

(1) According to one embodiment of the present invention, there is provided a semiconductor device comprising:
   a substrate on which a plurality of leads are formed; and
   a semiconductor chip mounted on the substrate in such a manner that a surface of the semiconductor chip having a plurality of electrodes faces the substrate,
   wherein each of the leads includes a first portion that is bonded to one of the electrodes and a second portion that extends outward from the inner side of a region in the substrate that overlays the semiconductor chip; and
   wherein the second portion is entirely adhered to the substrate and curved.

Since the second portion is curved in this embodiment, it is difficult to break. This makes it possible to increase the reliability of the electrical connection between the leads and the electrodes.

(2) According to one embodiment of the present invention, there is provided a semiconductor device comprising:
   a substrate on which a plurality of leads are formed; and
   a semiconductor chip mounted on the substrate in such a manner that a surface of the semiconductor chip having a plurality of electrodes faces the substrate,
   wherein each of the leads includes a first portion that is bonded to one of the electrodes and a second portion that continuously extends outward from the first portion; and
   wherein the second portion is entirely adhered to the substrate and curved.

Since the second portion is curved in this embodiment, it is difficult to break. This makes it possible to increase the reliability of the electrical connection between the leads and the electrodes.

(3) In any of the above semiconductor devices,
   the electrodes may be arranged along one edge of the semiconductor chip;
   the leads may be disposed so as to intersect the edge; and
   the first portion may be disposed on corresponding one of the electrodes at a position displaced from the center of the corresponding electrode in a direction parallel to the edge and toward the center of the edge.

(4) In any of the above semiconductor devices, the second portion may be curved so as to protrude in a direction parallel to the edge and away from the center of the edge.

(5) In any of the above semiconductor devices, each of the leads may further include a third portion that continuously extends from the second portion in a direction opposite to the first portion; and the first and third portions may be disposed to extend along one straight line.

(6) In any of the above semiconductor devices,
   each of the leads may further include a third portion that continuously extends from the second portion in a direction opposite to the first portion,
   the first portion extending along a first straight line, and
   the third portion extending along a second straight line that is parallel to the first straight line and displaced from the first straight line in a direction in which the second portion protrudes.

(7) In any of the above semiconductor devices, the electrodes may be disposed in a staggered arrangement.

(8) According to one embodiment of the present invention, there is provided an electronic module on which is mounted any of the above semiconductor devices.

(9) According to one embodiment of the present invention, there is provided an electronic instrument comprising any of the above semiconductor devices.

(10) According to one embodiment of the present invention, there is provided a method of fabricating a semiconductor device, the method comprising:
   (a) heating a semiconductor chip having a plurality of electrodes and a substrate on which a plurality of leads are provided;
   (b) mounting the semiconductor chip on the substrate in such a manner that each of the leads faces one of the electrodes; and
   (c) bonding each of the leads to one of the electrodes,
   wherein the substrate is formed of a material having a linear expansion rate that is greater than a linear expansion rate of the semiconductor chip; and
   wherein the substrate and the semiconductor chip are each heated in the step (a) at a temperature at which the rates of change of the lengths of the substrate and the semiconductor chip before and after the heating are the same.

Since the substrate and semiconductor chip are heated in this embodiment at temperatures at which the rates of change of the lengths thereof before and after the heating are the same, it is possible to make the movement of the leads and electrodes small. This makes it possible to increase the reliability of the electrical connection between the leads and the electrodes.

(11) According to one embodiment of the present invention, there is provided a method of fabricating a semiconductor device, the method comprising:
   (a) heating and expanding a semiconductor chip having a plurality of electrodes and a substrate on which a plurality of leads are provided;
   (b) mounting the semiconductor chip on the substrate in such a manner that a first portion of each of the leads faces one of the electrodes;
   (c) bonding the first portion to one of the electrodes; and
   (d) radiating heat of the semiconductor chip and the substrate and causing the semiconductor chip and the substrate to shrink,
   wherein each of the leads includes a second portion that continuously extends outward from the first portion and entirely adhered to the substrate; and
   wherein the step (d) includes:
   ($d_1$) causing the semiconductor chip to shrink at a shrinkage rate that is greater than a shrinkage rate of the substrate, applying a force of the shrinkage direction to the second portion through the first portion to curve the second portion; and
   ($d_2$) causing the substrate to shrink at a shrinkage rate that is greater than a shrinkage rate of the semiconductor chip, applying a force of the shrinkage direction to the second portion that is adhered to the substrate to curve the second portion.

Since the second portion is curved in this embodiment, it is difficult to break. This makes it possible to increase the reliability of the electrical connection between the leads and the electrodes.

(12) In this method of fabricating a semiconductor device, the electrodes may be arranged along one edge of the semiconductor chip;

the leads may be disposed in the step (b) so as to intersect the edge;

a protruding portion may be formed in the steps ($d_1$) and ($d_2$) to protrude in a direction parallel to the edge and away from the center of the edge;

the protruding portion may include a first curved portion that extends from the first portion and curves in the protrusion direction of the protruding portion and a second curved portion that curves in a direction back from the protrusion direction;

the first curved portion may be formed in the step ($d_1$); and the second curved portion may be formed in the step ($d_2$).

(13) In this method of fabricating a semiconductor device, the first portion facing corresponding one of the electrodes may be disposed at a position displaced from the center of the corresponding electrode in a direction parallel to the edge and toward the center of the edge, in the step (b).

(14) In this method of fabricating a semiconductor device, the first portion may be designed beforehand in such a manner that the first portion is disposed at a position displaced from the center of the corresponding electrode in a direction parallel to the edge and toward the center of the edge before the heating; and the substrate and the semiconductor chip may be heated in the step (a) at a temperature at which the rates of change of the lengths of the substrate and the semiconductor chip before and after the heating are the same.

(15) In this method of fabricating a semiconductor device, the first portion may be designed beforehand in such a manner that the centers of the first portion and the corresponding electrode coincide with each other in the widthwise direction before the heating; and the substrate and the semiconductor chip may be each heated in the step (a) at temperatures at which the rates of change of the lengths of the substrate and the semiconductor chip before and after the heating are different, in such a manner that the first portion is disposed at a position displaced from the center of the corresponding electrode in a direction parallel to the edge and toward the center of the edge.

The embodiments of the present invention will be described below with reference to the drawings.

FIRST EMBODIMENT

Figure 2:
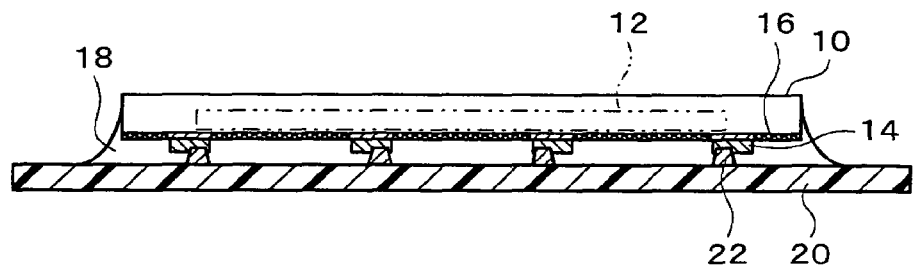
FIG. 2 is an enlarged section of the semiconductor device taken along the line II-II of FIG. 1.

FIG. 1 is illustrative of a semiconductor device according to a first embodiment of the present invention. FIG. 2 is an enlarged section of the semiconductor device taken along the line II-II of FIG. 1. The semiconductor device has a semiconductor chip 10. The semiconductor chip 10 could be of a three-dimensional cubic shape or of a two-dimensional rectangular shape. Integrated circuitry 12 is formed on the semiconductor chip 10. The semiconductor chip 10 has electrodes 14. The plurality of electrodes 14 are arranged along one edge of the semiconductor chip 10. The electrodes 14 could be, disposed in a staggered arrangement. Each electrode 14 could be a pad and a bump provided thereon. The electrodes 14 are formed of a metal such as gold or copper. The electrodes 14 are connected electrically to the interior of the semiconductor chip 10 and at least two of the electrodes 14 (either all the electrodes 14 or a plurality thereof that is not all of the electrodes 14) are connected electrically to the integrated circuitry 12. A passivation film 16 is formed so as to cover the integrated circuitry 12. The electrodes 14 are formed so as to be exposed from the passivation film 16.

The semiconductor device has a substrate 20. The substrate 20 could be of a film or a plate form. The substrate 20 is formed of a material that has a higher coefficient of thermal expansion (such as a linear coefficient of expansion) than that of the semiconductor chip 10. The substrate 20 could also have a low level of thermal radiation due to having a lower thermal conductivity ratio than the semiconductor chip 10. The substrate 20 could be formed of a resin such as a polyimide resin, or it could be formed of a compound material of an organic material such as a resin and an inorganic material.

A plurality of leads 22 are formed in the substrate 20. The leads 22 are formed of a metal such as copper. The leads 22 (such as the entirety thereof) could be adhered to the substrate 20 by adhesive (not shown in the figure) or the leads 22 (such as the entirety thereof) could be adhered to the substrate 20 directly, with no adhesive therebetween. The substrate 20 could have a shape that is linearly symmetrical about a line parallel to the direction in which the leads 22 extend.

The semiconductor chip 10 is mounted on the substrate 20. The packaging form of the semiconductor chip 10 could be chip-on-film (COF). The surface of the semiconductor chip 10 that has the electrodes 14 faces the substrate 20. An underfill member 18 could be provided between the semiconductor chip 10 and the substrate 20. The leads 22 and the electrodes 14 are connected electrically. The leads 22 and the electrodes 14 face each other. Either the leads 22 or the electrodes 14 could be deformed and the others of the leads 22 and the electrodes 14 could fit thereinto. The leads 22 are disposed in such a manner as to intersect (such as orthogonally) one edge of the semiconductor chip 10 (the edge on which the electrodes 14 are arranged).

A first portion 24 of each lead 22 is bonded to the corresponding electrode 14. The bond is not limited to just a bond formed by mutual crystallization of the materials of the first portion 24 and the electrode 14; it also includes a bond formed by interposing electrically conductive particles between the first portion 24 and the electrode 14. A second portion 26 of the lead 22 continuously extends from the first portion 24. The second portion 26 extends outward from the inner side of a region that overlays the semiconductor chip 10. The second portion 26 is entirely adhered to the substrate 20. The second portion 26 is curved. A third portion 28 of the lead 22 continuously extends from the second portion 26 in the direction opposite to that of the first portion 24.

Figure 3:
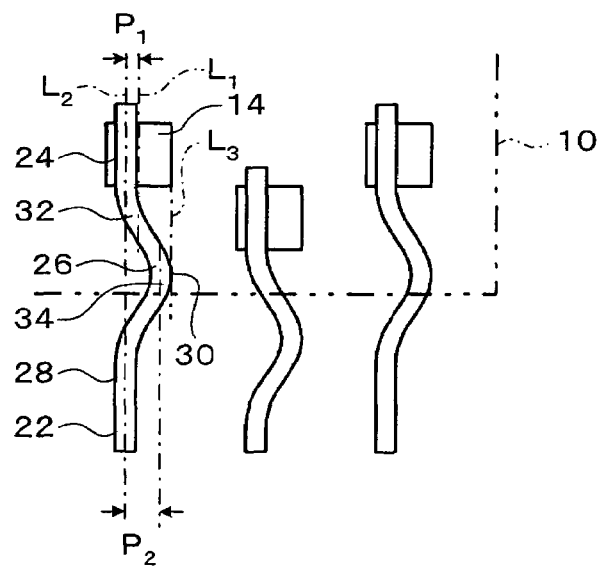
FIG. 3 is illustrative of the positions and shapes of the semiconductor chip, electrodes, and leads of the semiconductor device according to one embodiment of the present invention.

The positions and shapes of the semiconductor chip, electrodes, and leads of the semiconductor device are illustrated in FIG. 3. In FIG. 3, a straight line $L_1$ passes through the center of the electrode 14 and is used for regulating the pitch of the electrodes 14. A straight line $L_2$ is parallel to the straight line $L_1$ and displaced toward the center of one edge of the semiconductor chip 10 therefrom. The first portion 24 is disposed to extend along the straight line $L_2$. The second portion 26 is curved so as to bend in the direction of the straight line $L_1$ from the first portion 24 (the direction away from the straight line $L_2$) then return back toward the direction of the straight line $L_2$. The second portion 26 could also extend from the first portion 24 to intersect the straight line $L_1$. In other words, the second portion 26 could have a displacement that is greater than that of the first portion 24 from the electrode 14 (a pitch $P_1$) so as to protrude from the first portion 24.

The second portion 26 curves from the first portion 24 so as to protrude in a direction parallel to the edge of the semiconductor chip 10 and away from the center of the edge (to the right in FIG. 3). The direction away from the center is also the direction in which each first portion 24 is closer to one of the two sides of the edge of the semiconductor chip 10. The bonded first portion 24 and electrode 14 is disposed so that the first portion 24 is displaced in the direction parallel to the edge of the semiconductor chip 10 and toward the center of the edge. A protruding portion 30 of the second portion 26 is formed in such a manner that it does not pass a straight line $L_3$ that extends parallel to the straight line $L_1$, from the side edge of the electrode 14 (the side edge thereof in the direction in which the second portion 26 protrudes). In other words, since the second portions 26 do not extend into the regions between adjacent electrodes 14, the configuration is such that neighboring electrodes 14 do not touch.

Note that the protruding portion 30 includes a first curved portion 32 that curves from the first portion 24 in the direction of protrusion. The protruding portion 30 also includes a second curved portion 34 that curves in the direction back from the direction of protrusion thereof.

The third portion 28 is disposed so as to extend along the straight line $L_2$. The pitch $P_1$ of the electrode 14 and the first portion 24 and a pitch $P_2$ of the protruding portion 30 of the second portion 26 and the third portion 28 are preferably in the relationship: $P_1 < P_2$, and more preferably: $P_1 \leq P_2/2$.

Since this embodiment ensures that the second portion 26 of each lead 22 is curved, it is difficult for breaks to occur. This makes it possible to increase the reliability of the electrical connections between the leads 22 and the electrodes 14.

Figure 4A:
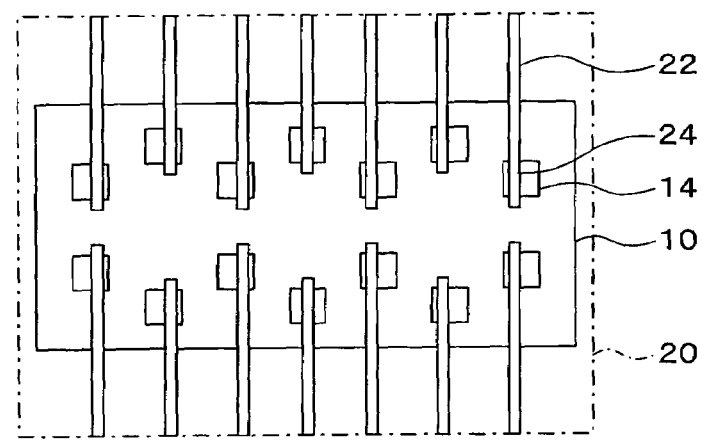
FIG. 4A is illustrative of the designed shape of the substrate and semiconductor chip used in the fabrication of the semiconductor device and FIG. 4B is illustrative of the method of fabricating a semiconductor device according to one embodiment of the present invention.

The description now turns to a method of fabricating a semiconductor device in accordance with an embodiment of the present invention. The designed shape of the substrate and semiconductor chip used in the fabrication of the semiconductor device is shown in FIG. 4A. Note that FIG. 4A shows only the region of the substrate 20 surrounded by broken lines in FIG. 1; hereinafter the same.

From the design viewpoint, the semiconductor chip 10 and the electrodes 14 are as described above. On the other hand, the leads 22 are designed to be formed curved, as previously described. With each first portion 24 and the facing electrode 14, the first portion 24 is designed beforehand to be displaced in the direction parallel to the edge of the semiconductor chip 10 and toward the center of the edge. This point is as described above.

Figure 4B:
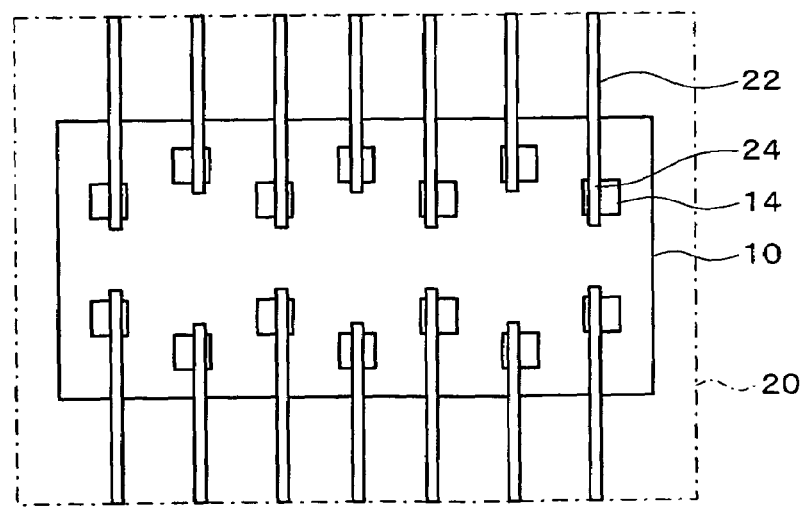

A method of fabricating a semiconductor device in accordance with this embodiment of the present invention is shown in FIG. 4B. With this embodiment, the substrate 20 on which the leads 22 are formed and the semiconductor chip 10 having the electrodes 14 are heated. This causes the substrate 20 and the semiconductor chip 10 to expand. In this case, the substrate 20 is formed of a material having a linear expansion rate that is greater than that of the semiconductor chip 10. For example, the substrate 20 could be formed of a resin and the semiconductor chip 10 could be formed of silicon. Thus, if they were to be heated to the same temperature, the substrate 20 and the semiconductor chip 10 would expand at the same ratio, but in this embodiment of the present invention the semiconductor chip 10 is heated to a greater temperature than the substrate 20. More specifically, the substrate 20 and the semiconductor chip 10 are each heated to a temperature that ensures that the rate of change of the length of each before and after the heating are the same. For example, the substrate 20 is heated to approximately 100° C. and the semiconductor chip 10 is heated to approximately 400° C. This makes it possible to ensure that the electrodes 14 and the leads 22 maintain the designed positional relationship, as is clear from a comparison of FIGS. 4A and 4B. In other words, each first portion 24 and the corresponding electrode 14 can be disposed in such a manner that the first portion 24 is displaced in the direction parallel to the edge of the semiconductor chip 10 and toward the center of the edge. Since the substrate 20 and the semiconductor chip 10 are heated in this embodiment to temperatures that ensure that the rates of change of the lengths thereof before and after the heating are the same, the displacements of the designed positions of the leads 22 and the electrodes 14 can be made small. This makes it possible to increase the reliability of the electrical connections between the leads 22 and the electrodes 14.

With this embodiment, the semiconductor chip 10 is mounted on the substrate 20 in such a manner that each of the leads 22 corresponds to one of the electrodes 14. The leads 22 and the electrodes 14 are then bonded. A metal bond could be employed for this bonding, or an adhesive could be used therefor, or electrically conductive particles could be interposed between each first portion 24 and the corresponding electrode 14. The electrode 14 and the first portion 24 could also be fixed.

Heat of the semiconductor chip 10 and the substrate 20 are then radiated and the semiconductor chip 10 and the substrate 20 are caused to shrink. This step may include the steps illustrated in FIGS. 5 and 6.

Figure 5:
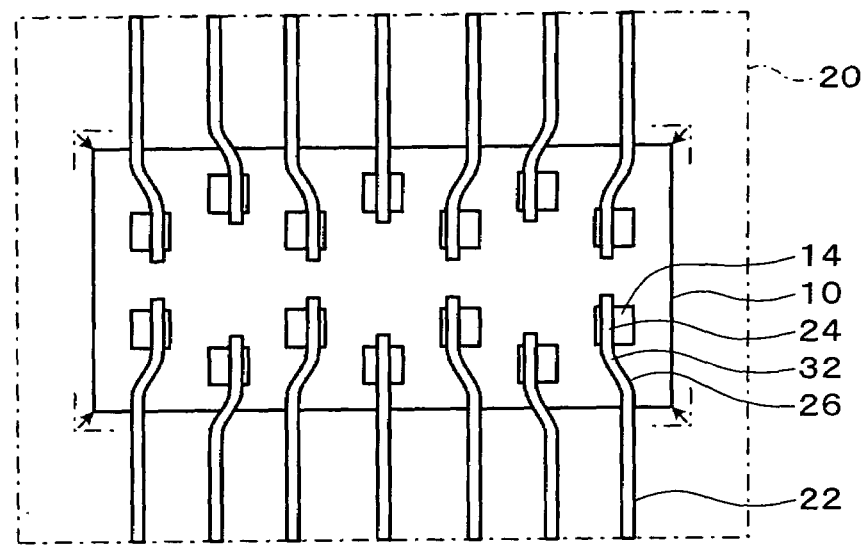
FIG. 5 is illustrative of the method of fabricating a semiconductor device according to one embodiment of the present invention.

As shown in FIG. 5, the semiconductor chip 10 first shrinks at a rate that is greater than that of the substrate 20. The resultant compressive forces apply a force on the second portion 26 in the direction of shrinkage, through the first portion 24 bonded to the electrode 14. This causes the second portion 26 to curve. More specifically, the first curved portion 32 is formed to curve from the first portion 24 in the direction of protrusion of the protruding portion 30 (see FIG. 3).

Figure 6:
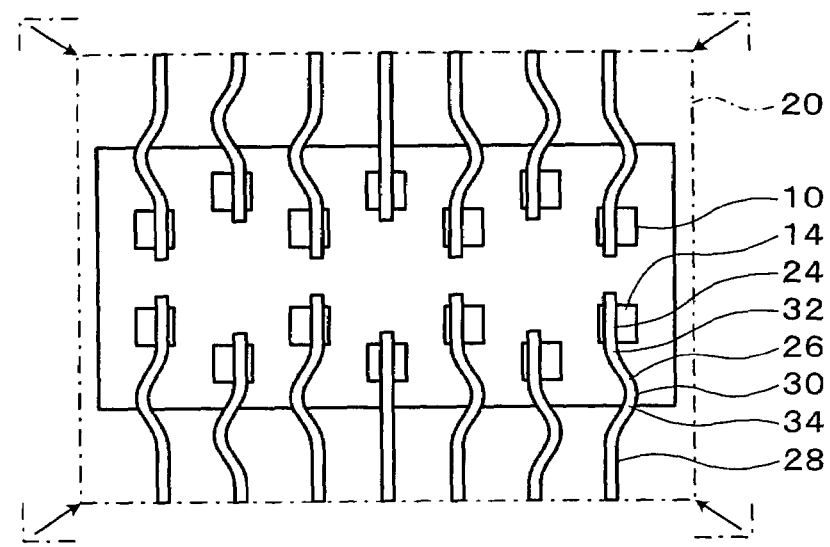
FIG. 6 is illustrative of the method of fabricating a semiconductor device according to one embodiment of the present invention.

The substrate 20 then shrinks at a rate that is greater than that of the semiconductor chip 10, as shown in FIG. 6, and the resultant compressive forces apply a force to the second portion 26 adhered to the substrate 20, in the direction of shrinkage. This causes the second portion 26 to curve. More specifically, the second curved portion 34 is formed to curve back in the direction away from the direction of protrusion of the protruding portion 30 (see FIG. 3).

The method of fabricating a semiconductor device in accordance with this embodiment could also comprise processes that can be derived from the above description of the semiconductor device. Since the second portion 26 of each of the leads 22 is curved in accordance with this embodiment, it is difficult to break. This makes it possible to increase the reliability of the electrical connections between the leads 22 and the electrodes 14.

SECOND EMBODIMENT

Figure 7:
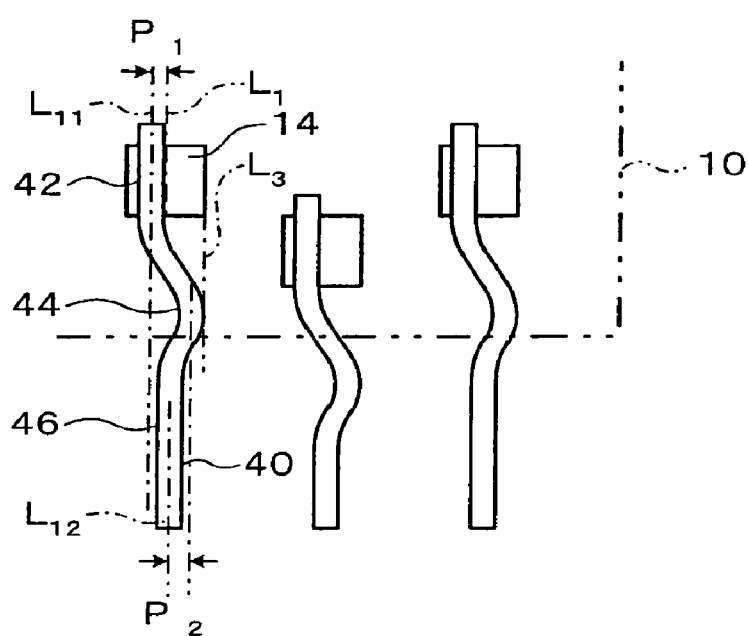
FIG. 7 is illustrative of the positions and shapes of the semiconductor chip, electrodes, and leads of the semiconductor device according to the second embodiment of the present invention.

A semiconductor device in accordance with a second embodiment of the present invention is shown in FIG. 7. The example shown in FIG. 7 is a variant of that shown in FIG. 3. In FIG. 7, details of the semiconductor chip 10 and the electrodes 14 correspond to those of the first embodiment. A first portion 42 of a lead 40 is bonded to the electrode 14. A second portion 44 of the lead 40 continuously extends from the first portion 42. The lead 40 further includes a third portion 46 that continuously extends from the second portion 44, in the opposite direction from the first portion 42. The first portion 42 is disposed so as to extend on a first straight line $L_{11}$. The third portion 46 is disposed so as to extend on a second straight line $L_{12}$. The second straight line $L_{12}$ is parallel to the first straight line $L_{11}$, displaced therefrom in the direction in which the second portion 44 protrudes. All other details of the lead 40 are similar to those of the lead 22.

Figure 8A:
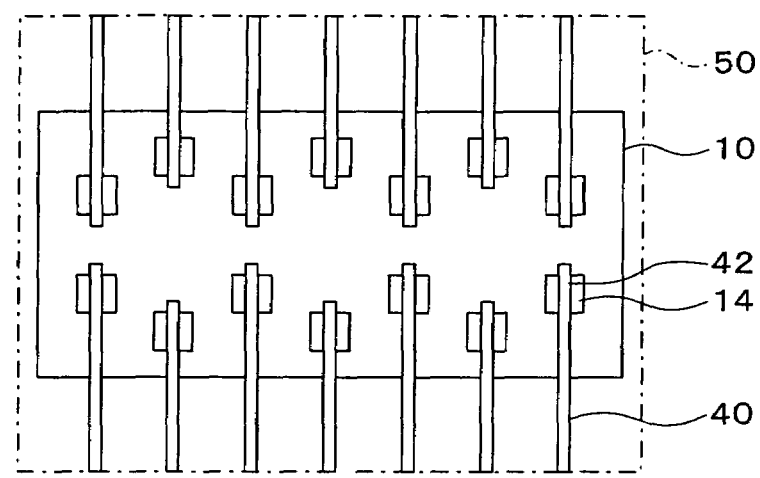
FIG. 8A is illustrative of the designed shape of the substrate and semiconductor chip used in the fabrication of the semiconductor device and FIG. 8B is illustrative of the method of fabricating a semiconductor device according to one embodiment of the present invention.

The description now turns to a method of fabricating a semiconductor device in accordance with this embodiment. The designed shape of the substrate and semiconductor chip used in the fabrication of the semiconductor device is shown in FIG. 8A.

From the design viewpoint, the description of the semiconductor chip 10 and the electrodes 14 is as above. The design of the lead 40, however, is formed to be curved as shown in FIG. 7. The electrode 14 and the corresponding first portion 42 are designed beforehand to have centers that coincide with each other in the widthwise direction.

Figure 8B:
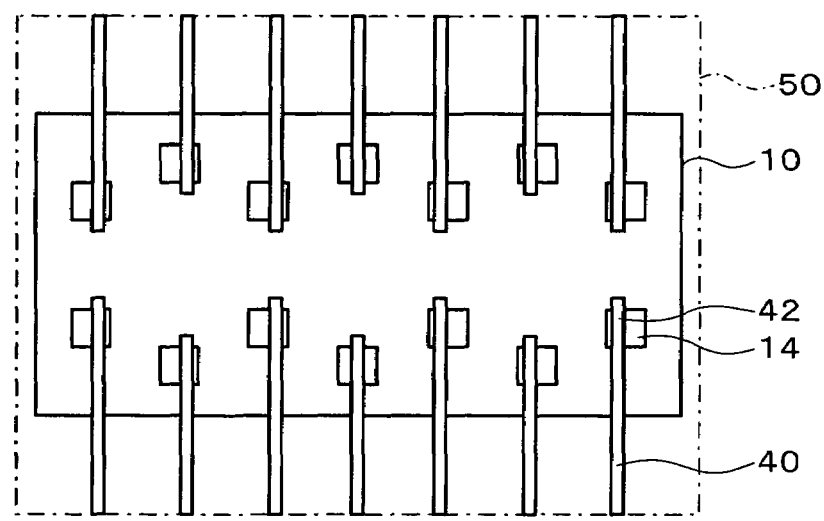

A method of fabricating a semiconductor device in accordance with this embodiment of the present invention is shown in FIG. 8B. With this embodiment, a substrate 50 on which is formed a plurality of the leads 40 and the semiconductor chip 10 having the electrodes 14 are heated. This causes the substrate 50 and the semiconductor chip 10 to expand. This embodiment differs from the first embodiment in that the substrate 50 and the semiconductor chip 10 are heated to temperatures at which the rates of change of the lengths thereof before and after the heating are different, so that each first portion 42 is displaced in the direction parallel to the edge of the semiconductor chip 10 and toward the center of the edge. For example, the substrate 50 is heated to a temperature that is lower than that of the first embodiment. This makes it possible for the positions of the electrodes 14 and the leads 40 to shift, as is clear from a comparison of FIGS. 8A and 8B. The result is as described with reference to the first embodiment.

With this embodiment too, the semiconductor chip 10 is mounted on the substrate 50 in such a manner that each of the leads 40 corresponds to one of the electrodes 14. The leads 40 and the electrodes 14 are then bonded.

Heat of the semiconductor chip 10 and the substrate 50 are then radiated and the semiconductor chip 10 and the substrate 50 are caused to shrink. This step may include the steps illustrated in FIGS. 9 and 10.

Figure 9:
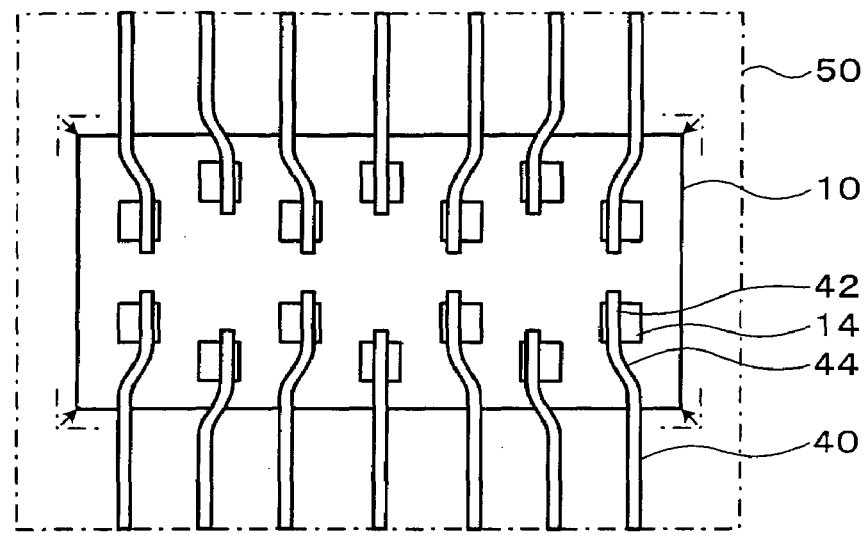
FIG. 9 is illustrative of the method of fabricating a semiconductor device according to one embodiment of the present invention.

As shown in FIG. 9, the semiconductor chip 10 first shrinks at a rate that is greater than that of the substrate 50. The resultant compressive forces apply a force on the second portion 44 in the direction of shrinkage, through the first portion 42 bonded to the electrode 14. This causes the second portion 44 to curve.

Figure 10:
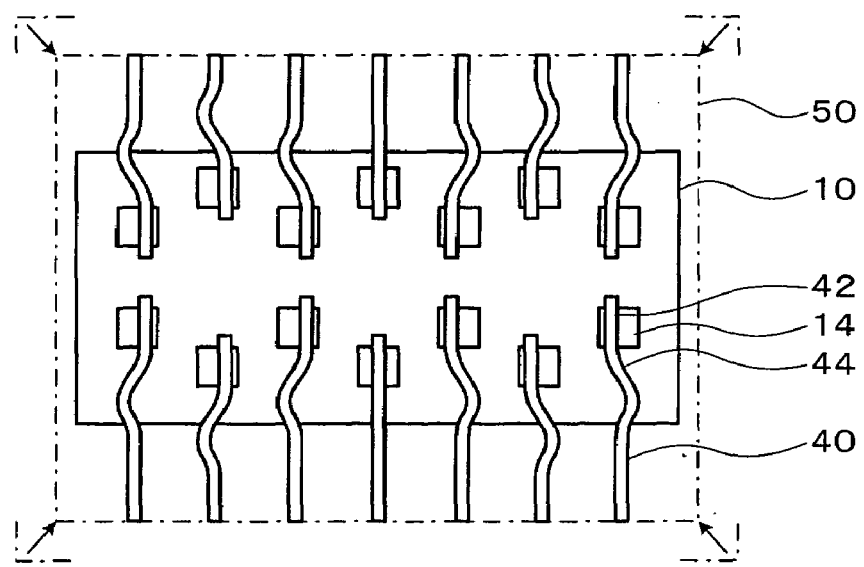
FIG. 10 is illustrative of the method of fabricating a semiconductor device according to one embodiment of the present invention.

The substrate 50 then shrinks at a rate that is greater than that of the semiconductor chip 10, as shown in FIG. 10, and the resultant compressive forces apply a force to the second portion 44 adhered to the substrate 50, in the direction of shrinkage. This causes the second portion 44 to curve. This curve is smaller than that of the first embodiment. This is because the expansion of the substrate 50 is less than that of the substrate 20 of the substrate 20, so that the shrinkage is less. This difference distinguishes between this embodiment and the first embodiment. All other details correspond to those described with reference to the first embodiment.

Figure 11:
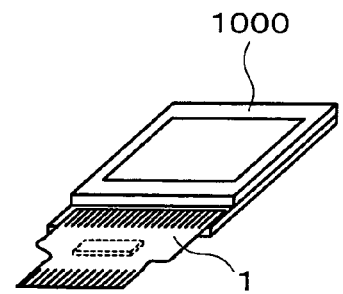
FIG. 11 shows an electronic module on which is mounted the semiconductor device according to one embodiment of the present invention.
Figure 12:
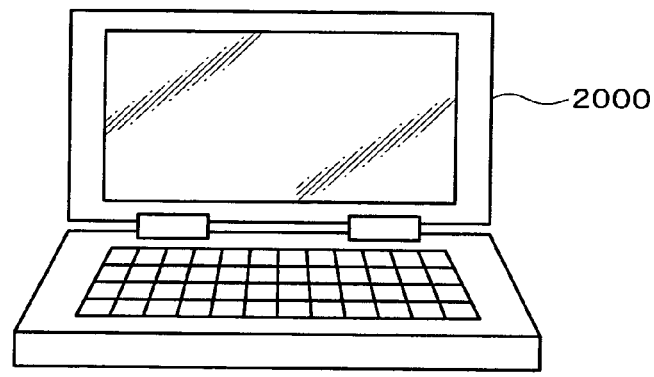
FIG. 12 shows an electronic instrument having the semiconductor device according to one embodiment of the present invention.
Figure 13:
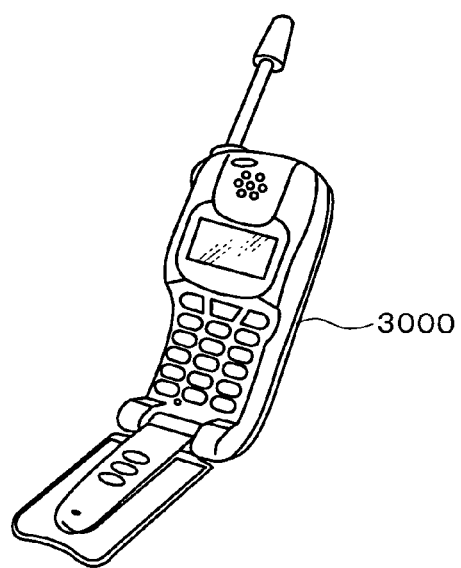
FIG. 13 shows an electronic instrument having the semiconductor device according to one embodiment of the present invention.

An electronic module (such as a liquid crystal module) 1000 on which is mounted a semiconductor device 1 in accordance with the above-described embodiment of the present invention is shown in FIG. 11. A notebook personal computer 2000 shown in FIG. 12 and a portable phone 3000 shown in FIG. 13 are examples of electronic instruments having this semiconductor device.

Although only some embodiments of the present invention have been described in detail above, those skilled in the art will readily appreciate that many modifications are possible in the embodiments without departing from the novel teachings and advantages of this invention. Accordingly, all such modifications are intended to be included within the scope of this invention.

What is claimed is:

1. A semiconductor device comprising:
a substrate on which a plurality of leads are formed; and
a semiconductor chip mounted on the substrate in such a manner that a surface of the semiconductor chip having a plurality of electrodes faces the substrate,
wherein each of the plurality of leads includes a first portion that is bonded to one of the plurality of electrodes and a second portion that extends outward from an inner side of a region in the substrate that overlays the semiconductor chip;
the second portion is entirely adhered to the substrate and curved;
the plurality of electrodes include first electrodes which are arranged along one edge of the semiconductor chip and disposed on a portion of the semiconductor chip except for the center of the edge;
the plurality of leads include first leads which are disposed so as to intersect the edge; and
the first portion of each of the first leads is disposed on corresponding one of the first electrodes at a position displaced from the center of the corresponding one of the first electrodes in a direction parallel to the edge and toward the center of the edge.

2. The semiconductor device as defined in claim 1, wherein the second portion of each of the first leads is curved so as to protrude in a direction parallel to the edge and away from the center of the edge.

3. The semiconductor device as defined in claim 2, wherein:
each of the leads further includes a third portion that continuously extends from the second portion in a direction opposite to the first portion; and
the first and third portions are disposed to extend on one straight line.

4. The semiconductor device as defined in claim 2, wherein each of the leads further includes a third portion that continuously extends from the second portion in a direction opposite to the first portion,
the first portion extending along a first straight line, and
the third portion extending along a second straight line that is parallel to the first straight line and displaced from the first straight line in a direction in which the second portion protrudes.

5. The semiconductor device as defined in claim 1, wherein the electrodes are disposed in a staggered arrangement.

6. A semiconductor device comprising:
a substrate on which a plurality of leads are formed; and
a semiconductor chip mounted on the substrate in such a manner that a surface of the semiconductor chip having a plurality of electrodes faces the substrate, wherein each of the plurality of leads includes a first portion that is bonded to one of the plurality of electrodes and a second portion that continuously extends outward from the first portion;

the second portion is entirely adhered to the substrate and curved;

the plurality of electrodes include first electrodes which are arranged along one edge of the semiconductor chip and disposed on a portion of the semiconductor chip except for the center of the edge;

the plurality of leads include first leads which are disposed so as to intersect the edge; and the first portion of each of the first leads is disposed on corresponding one of the first electrodes at a position displaced from the center of the corresponding one of the first electrodes in a direction parallel to the edge and toward the center of the edge.

7. The semiconductor device as defined in claim 6, wherein the second portion of each of the first leads is curved so as to protrude in a direction parallel to the edge and away from the center of the edge.

8. The semiconductor device as defined in claim 7, wherein:

each of the leads further includes a third portion that continuously extends from the second portion in a direction opposite to the first portion; and the first and third portions are disposed to extend on one straight line.

9. The semiconductor device as defined in claim 7, wherein each of the leads further includes a third portion that continuously extends from the second portion in a direction opposite to the first portion, the first portion extending along a first straight line, and the third portion extending along a second straight line that is parallel to the first straight line and displaced from the first straight line in a direction in which the second portion protrudes.

10. The semiconductor device as defined in claim 6, wherein the electrodes are disposed in a staggered arrangement.

* * * * *